United States Patent [19]

Pigott

[11] Patent Number: 5,128,634
[45] Date of Patent: Jul. 7, 1992

[54] OSCILLATOR CIRUCIT INDEPENDENT OR PARASITIC CAPACITORS

[75] Inventor: John M. Pigott, Phoenix, Ariz.

[73] Assignee: Motorola, Inc., Schaumburg, Ill.

[21] Appl. No.: 604,278

[22] Filed: Oct. 29, 1990

[51] Int. Cl.$^5$ .............................................. H03B 5/00
[52] U.S. Cl. .................................................. 331/143
[58] Field of Search ...................... 331/111, 113 R, 143, 331/144

[56] References Cited

U.S. PATENT DOCUMENTS 4,623,852 11/1986 Abou et al. ........................ 331/111

Primary Examiner—Robert J. Pascal
Attorney, Agent, or Firm—Bradley J. Botsch

[57] ABSTRACT

An oscillator circuit providing an output signal having a predetermined frequency of oscillation includes a comparator circuit having first and second inputs and an output, the first input being coupled to a node, and the second input being coupled to a terminal at which a reference voltage is applied. A capacitor is coupled between the first input of the comparator circuit and the output of the comparator circuit wherein the capacitor has parasitic capacitances associated therewith. A switchable current circuit responsive to the output of the comparator circuit for pushing current into the node when the output of the comparator circuits is in a first logic state thereby charging the capacitor, and for pulling current out of the node when the output of the comparator circuit is in a second logic state thereby discharging the capacitor wherein the predetermined frequency of oscillation of the oscillator circuit is independent of the parasitic capacitor.

10 Claims, 1 Drawing Sheet

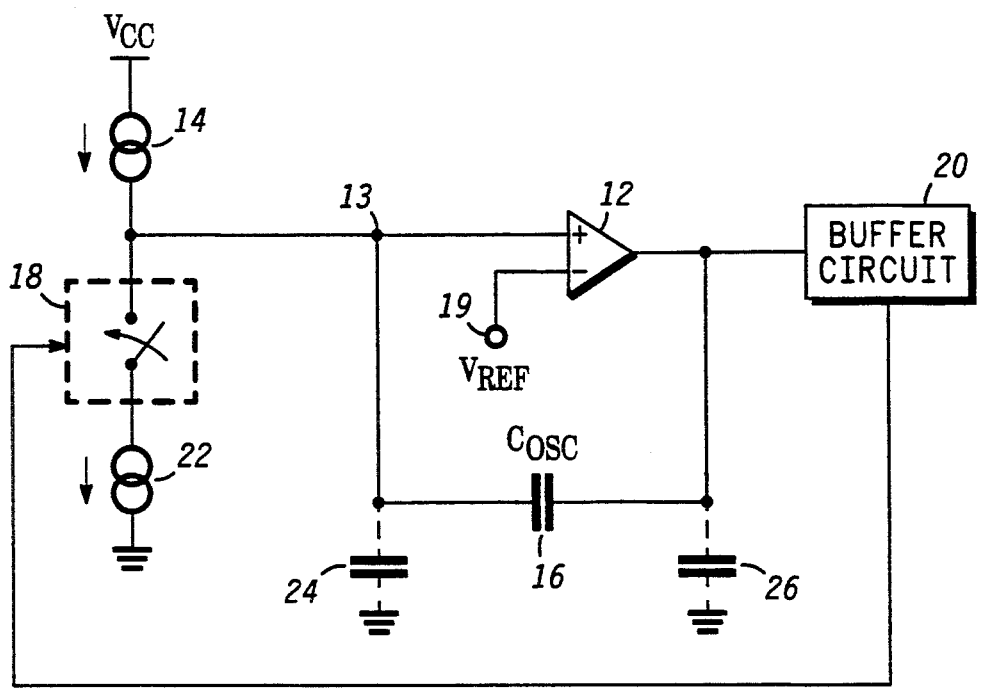
FIG. 1
FIG. 2
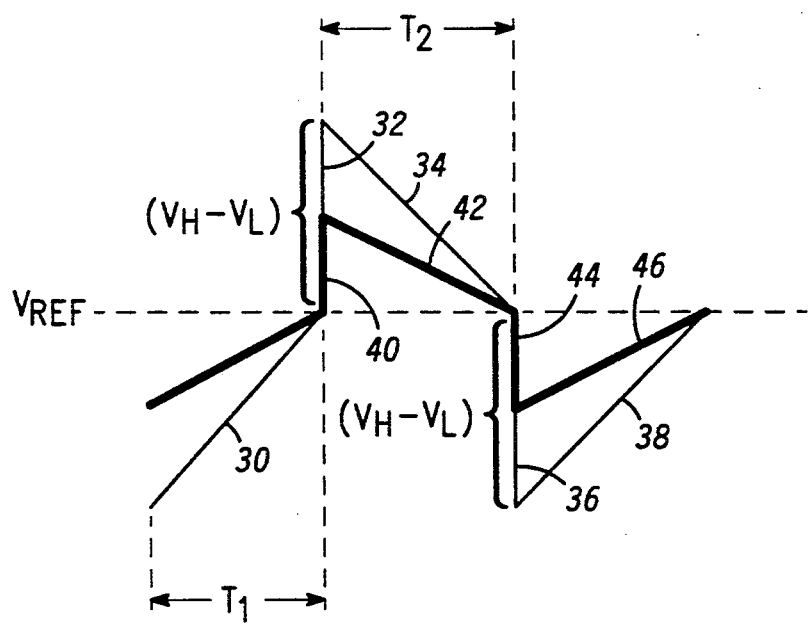

OSCILLATOR CIRUCIT INDEPENDENT OR PARASITIC CAPACITORS

BACKGROUND OF THE INVENTION

This invention relates to oscillators and, in particular, an oscillator circuit having a frequency of operation that is unaltered by the existence of parasitic capacitors.

Oscillator circuits have many applications and are widely used throughout industry. The frequency of oscillation ($F_{OSC}$) of an oscillator circuit is typically a function of an oscillator capacitor utilized therein. However, the frequency of oscillation of most, if not all, oscillator circuits is also typically a function of parasitic capacitors which can exist at one or both terminals of the oscillator capacitor. Further, these parasitic capacitors are typically coupled in parallel with the oscillator capacitor and, thus, directly adding to the capacitance of the oscillator capacitor. Therefore, parasitic capacitors can substantially alter the frequency of oscillation of an oscillator circuit.

Hence, a need exists for an oscillator circuit having a frequency of oscillation that is substantially independent of parasitic capacitors.

SUMMARY OF THE INVENTION

Accordingly, it is an objective of the present invention to provide an improved oscillator circuit.

Another objective of the present invention is to provide an improved oscillator circuit having a frequency of oscillation that is substantially independent of parasitic capacitors.

Still another objective of the present invention is to provide an improved oscillator circuit having a frequency of oscillation that is substantially unaltered by the existence of parasitic capacitors therein.

In carrying out the above and other objects of the present invention there is provided an oscillator circuit comprising a comparator circuit having first and second inputs and an output, the first input being coupled to a node, and the second input being coupled to a terminal at which a reference voltage is applied; a capacitor coupled between the first input of the comparator circuit and the output of the comparator circuit; and a switchable current circuit responsive to the output of the comparator circuit for pushing current into the node when the output of the comparator circuit is in a first logic state thereby charging the capacitor, and for pulling current out of the node when the output of the comparator circuit is in a second logic state thereby discharging the capacitor.

The above and other objects, features and advantages of the present invention will be better understood from the following detailed description taken in conjunction with the accompanying drawings.

BRIEF DESCRIPTION OF THE DRAWINGS

FIG. 1 is a partial schematic diagram illustrating the oscillator circuit of the present invention; and FIG. 2 is a graphical representation of a waveform occurring at a node in the oscillator circuit of FIG. 1.

DETAILED DESCRIPTION OF THE PREFERRED EMBODIMENT

Referring to FIG. 1, a partial schematic diagram illustrating oscillator circuit 10 of the present invention is shown comprising comparator circuit 12 having a first input coupled to node 13. Node 13 is coupled by current source 14 to a first supply voltage terminal at which the operating potential $V_{CC}$ is applied. Further, node 13 is also coupled to a first terminal of capacitor 16 and to a first terminal of switch 18. The second input of comparator circuit 12 is coupled to terminal 19 at which a reference voltage $V_{REF}$ is applied. Finally, the output of comparator circuit 12 is coupled to a second terminal of capacitor 16 and to an input of buffer circuit 20. The output of buffer circuit 20 is coupled to a control input of switch 18, the latter having a second terminal coupled to ground reference by current source 22. Further, parasitic capacitors 24 and 26 are shown coupled to capacitor 16. In particular, parasitic capacitor 24 is coupled between the first terminal of capacitor 16 and ground reference, while parasitic capacitor 26 is coupled between the second terminal of capacitor 16 and ground reference.

In analysis, first assume that parasitic capacitors 24 and 26 do not exist and assume an initial starting point where the voltage at node 13 is substantially less than voltage $V_{REF}$ and thereby asserting the output of comparator circuit 12 at a logic low. The output of buffer circuit 20 correspondingly provides a logic low at the control input of switch 18 thereby asserting switch 18 in an open position and de-coupling current source 22 from node 13. Current source 14 functions to push current into node 13 thereby charging capacitor 16. Further, the charging of capacitor 16 by current source 14 linearly increases the voltage at node 13 with time and generates segment 30 as shown in FIG. 2 whereby the thinner waveform in FIG. 2 is a graphical representation of a voltage waveform occurring at node 13 of oscillator circuit 10 with the assumption that no parasitic capacitors exist. The thicker voltage waveform of FIG. 2 is indicative of the waveform occurring at node 13 when parasitic capacitor 24 is substantially equal to oscillator capacitor 16 and will be described hereinafter.

Once the voltage at node 13 charges to a voltage that exceeds voltage $V_{REF}$, the output of comparator circuit 12 switches from an initial logic low voltage level, $V_L$ to a logic high voltage level, $V_H$. It is understood that $V_L$ represents a logic low voltage level for comparator circuit 12 while $V_H$ represents a logic high voltage level for comparator circuit 12. Thus, the second terminal of capacitor 16 has increased in voltage substantially equal to the voltage magnitude $(V_H-V_L)$. Further, since the voltage across capacitor 16 cannot change instantaneously, the voltage at node 13 also rises by a potential substantially equal to the voltage magnitude $(V_H-V_L)$. Or equivalently, the voltage at node 13 rises from an initial voltage VREF to a voltage substantially equal to the voltage $\{V_{REF}+(V_H-V_L)\}$. This sharp voltage rise occurring at node 13 is represented by segment 32 as shown in FIG. 2. Further, the logic high voltage level occurring at the output of comparator circuit 12 is transferred through buffer circuit 20 and provides a logic high at the control input of switch 18 thereby closing switch 18. When switch 18 is closed, current source 22 is coupled to node 13. In a preferred embodiment, current source 22 provides a current that is substantially larger than the current provided by current source 14. Therefore, when current source 22 is coupled to node 13, current sources 22 and 14 function together to pull current out of node 13 and thereby discharging capacitor 16 with a current substantially equal to the current provided by current source 22 lessened by the current provided by current source 14

($I_{22}-I_{14}$). Thus, node 13 linearly decreases in voltage thereby generating segment 34 as shown in FIG. 2.

The voltage at node 13 decreases until the voltage thereof falls below voltage $V_{REF}$ thereby switching the output of comparator circuit 12 from a logic high state ($V_H$) to a logic low state ($V_L$). Thus, the second terminal of capacitor 16 has decreased in voltage substantially equal to the voltage magnitude ($V_H-V_L$). As aforementioned, the voltage across capacitor 16 cannot change instantaneously and thus, the voltage at node 13 also decreases by a potential substantially equal to the voltage magnitude ($V_H-V_L$). Or equivalently, the voltage at node 13 decreases from the initial voltage VREF to a voltage substantially equal to the voltage $\{V_{REF}-(V_H-V_L)\}$. This sharp instantaneous voltage drop occurring at node 13 is represented by segment 36 as shown in FIG. 2. In addition, the logic low present at the output of comparator circuit 12 is transferred through buffer circuit 20 to provide a logic low at the control input of switch 18 thereby reopening switch 18. The opening of switch 18 again decouples current source 22 from node 13 and the cycle begins all over again. That is to say that current source 14 again pushes current into node 13 thereby charging node 13 and generating segment 38 as shown in FIG. 2. Segments 30, 32, 34 and 36 comprise one period of the voltage waveform generated at node 13 as shown in FIG. 2. Furthermore, segment 38 is identical to segment 30 with the exception that it occurs substantially one period later in time as shown.

The frequency of oscillation ($F_{OSC}$) of oscillator circuit 10 can be calculated as follows:

$$F_{OSC} = 1/(T_1+T_2) \quad (1)$$

where
$T_1$ is the time for generating segments 30 and 32 as shown in FIG. 2; and
$T_2$ is the time for generating segments 34 and 36 as shown in FIG. 2.

Further, $T_1$ and $T_2$ can be calculated by utilizing the general equation for the voltage and current across a capacitor of $I=C \times (dV/dt)$ as follows:

$$T_1 = \{C_{16} \times (V_H-V_L)\}/I_{14} \quad (2)$$

$$T_2 = \{C_{16} \times (V_H-V_L)\}/(I_{22}-I_{14}) \quad (3)$$

where
$C_{16}$ is the capacitance of oscillator capacitor 16;
($V_H-V_L$) is the differential voltage magnitude occurring at node 13 due to the switching of the output of comparator circuit 12;
$I_{14}$ is the current provided by current source 14; and
$I_{22}$ is the current provided by current source 22.

Upon substituting Eqns. (2) and (3) into Eqn. (1), one can obtain the frequency of oscillation to be substantially equal to:

$$F_{OSC} = \{C_{16} \times (V_H-V_L)\}^{-1} \times (I_{22}-I_{14}) \times (I_{14}/I_{22}) \quad (4)$$

Thus, the frequency of oscillation is a function of oscillator capacitor 16, the differential voltage magnitude ($V_H-V_L$), and of current sources 14 and 22. It is worth noting that the frequency of oscillation is not a function of voltage VREF or of any internal offset voltages of comparator circuit 12.

The above description assumed that parasitic capacitors 24 and 26 were not present. However, in accordance with the present invention, it shall be shown that even with the presence of parasitic capacitors 24 and 26, the frequency of oscillation of oscillator circuit 10 will not change.

First, in analyzing the effects of parasitic capacitor 26, one must realize that parasitic capacitor 26 is driven from a low impedance output of comparator circuit 12. Therefore, the output of comparator circuit 12 will supply the required current needed to charge parasitic capacitor 26 to whatever voltage is required. Therefore, it must be realized that parasitic capacitor 26 does not affect the final voltage that the output of comparator circuit 12 reaches. It is worth noting that as the value of parasitic capacitor 26 increases, the time required to complete a logic transition ($V_H$ to $V_L$ or $V_L$ to $V_H$) at the output of comparator circuit 12 increases. However, it must be realized that the only restriction on the value of parasitic capacitor 26 is that it not be too large so as to slow down the switching of the output of comparator circuit 12 and thereby preventing the output of comparator circuit 12 from completing a full logic state transition in the time that oscillator capacitor 16 has respectively charged or discharged to voltage VREF. This would mean that comparator circuit 12 would be attempting to switch from a first logic state to a second logic state before its output actually reached the first logic state.

In analyzing the effects of parasitic capacitor 24, assume, for simplicity, that the value of parasitic capacitor 24 is substantially equal to the value of oscillator capacitor 16. In reference to an earlier discussion where it was assumed that parasitic capacitor 26 was substantially equal to zero, when the voltage at node 13 exceeds voltage $V_{REF}$, the output of comparator circuit 12 switched from a logic low voltage level ($V_L$) to a logic high voltage level ($V_H$). Further, as aforedescribed, the voltage at node 13 rose from an initial voltage VREF to a voltage substantially equal to the voltage $\{V_{REF}+(V_H-V_L)\}$. However, with parasitic capacitor 24 being substantially equal to oscillator capacitor 16, the voltage at node 13 will only rise to a voltage substantially equal to $\{V_{REF}+(\frac{1}{2}) \times (V_H-V_L)$ as shown in FIG. 2 by segment 40. The primary reason that the voltage at node 13 only increases one half the voltage magnitude above $V_{REF}$ as compared to when parasitic capacitor 24 was substantially equal to zero is that there are two capacitors in series with the output of comparator circuit 12. Thus, there exists a charge sharing effect between oscillator capacitor 16 and parasitic capacitor 26. It is worth noting at this time that parasitic capacitor 26 simply charges to a voltage substantially equal to the logic high voltage level appearing at the output of comparator circuit 12.

Further, as aforedescribed, the logic high voltage level occurring at the output of comparator circuit 12 is transferred via buffer circuit 20 to the control input of switch 18 thereby closing switch 18 and coupling current source 22 to node 13. Therefore, the same current that discharged oscillator capacitor 16 when parasitic capacitor 24 was substantially equal to zero, also discharges both oscillator capacitor 16 and parasitic capacitor 24. It is very important to realize that the equivalent capacitance being discharged at node 13 is substantially equal to oscillator capacitor 16 in parallel with parasitic capacitor 24 since, from an ac point of view, oscillator capacitor 16 essentially has its right side coupled to ground by the output of comparator circuit 12. Therefore, current sources 22 and 14 function together as previously described to discharge the capacitance occurring at node 13 which is the sum of the capacitances of oscillator capacitor 16 plus parasitic capacitor 24, or for the above example, a capacitance substantially equal to twice the capacitance of oscillator capacitor 16. As a result, the voltage at node 13 decreases only one-half as fast as when parasitic capacitor 24 was substantially equal to zero. This is illustrated in FIG. 2 by segment 42 which decreases substantially half the rate as segment 34. As a result, this compensates for the fact that parasitic capacitor 24 only allowed the voltage at node 13 to rise up to a peak voltage level of $\{V_{REF}+(\frac{1}{2})\times(V_H-V_L)\}$. In summary, for parasitic capacitor 24 substantially equal to oscillator capacitor 16, the voltage at node 13 was allowed to increase only one half the voltage magnitude above $V_{REF}$ as when parasitic capacitor 24 was substantially equal to zero. However, the voltage at node 13 is decreased at one half the rate as when parasitic capacitor 24 was substantially equal to zero. Therefore, the waveform begins at a point substantially equal to $V_{REF}$ and rises to some point, which is basically insignificant with respect to frequency, and then returns back to voltage $V_{REF}$ in substantially the same amount of time independent of the value of parasitic capacitor 24.

Likewise, segments 44 and 46 are generated in an analogous manner as aforedescribed for segments 36 and 38 with the exceptions that segment 44 only decreases to a minimum voltage of $\{V_{REF}-(\frac{1}{2})\times(V_H-V_L)\}$, and segment 46 decreases at a rate one half slower than when parasitic capacitor 26 was substantially equal to zero. This, of course, is attributed to the fact that parasitic capacitor 24 is now substantially equal to oscillator capacitor 16, and the generation of segments 44 and 46 can be respectively explained in a similar aforedescribed manner pertaining to segments 40 and 42. Therefore, the waveform begins at a point substantially equal to $V_{REF}$ and decreases to some voltage which is basically insignificant with respect to frequency, and then returns back to voltage $V_{REF}$ in substantially the same amount of time independent of the value of parasitic capacitor 24. Thus, it should be realized that the period (as well as as the frequency) of the voltage waveform occurring at node 13 is independent of the value of capacitor 24.

It should be realized by one of ordinary skill in the art that if parasitic capacitor 24 was substantially equal to 1/10 the value of oscillator capacitor 16, the voltage at node 13 would only increase to a peak voltage substantially equal $\{V_{REF}+(10/11)\times(V_H-V_L)\}$. However, the voltage at node 13 would decrease at a rate of 1/11 slower than when parasitic capacitor 24 was substantially equal to zero. Thus, the period of the waveform at node 13 of oscillator circuit 10 remains unchanged for any value of parasitic capacitor 24. Further, parasitic capacitor 26 does not affect the period of the waveform either, as explained earlier. It should be realized that oscillator circuit 10 will provide a signal of predetermined frequency even if the values of parasitic capacitors 24 and 26 are unknown or vary with time.

By now it should be apparent from the foregoing discussion that a novel oscillator circuit has been provided having a frequency of oscillation that is substantially independent of parasitic capacitors.

I claim:
1. An oscillator circuit, comprising:
  a comparator circuit having first and second inputs and an output, said first input being coupled to a node, and said second input being coupled to a terminal at which a reference voltage is applied;
  capacitive means coupled between said first input of said comparator circuit and said output of said comparator circuit; and
  switchable current means responsive to said output of said comparator circuit for pushing current into said node when said output of said comparator circuit is in a first logic state thereby charging said capacitive means, and for pulling current out of said node when said output of said comparator circuit is in a second logic state thereby discharging said capacitive means, said switchable current means including:
    a first current source having first and second terminals, said first terminal being coupled to a first supply voltage terminal, and said second terminal being coupled to said node;
    a second current source having first and second terminals, said second terminal being coupled to a second supply voltage terminal; and
    a switch having first and second terminals and a control input, said first terminal being coupled to said node, said second terminal being coupled to said first terminal of said second current source, and said control input being coupled to said output of said comparator circuit, said switch alternately couples and de-couples said second current source to said node.

2. The oscillator circuit according to claim 1 wherein said second current source provides a current substantially larger than a current provided by said first current source.

3. The oscillator circuit according to claim 2 further comprises a buffer circuit coupled between said output of said comparator circuit and said control input of said switch of said switchable current means.

4. An oscillator circuit, comprising:
  a comparator circuit having first and second inputs and an output, said first input being coupled to a node, and said second input being coupled to a terminal at which a reference voltage is applied;
  a capacitor coupled between said first input of said comparator circuit and said output of said comparator circuit;
  a switch circuit having first and second terminals and a control input, said first terminal being coupled to said node, and said control input being coupled to said output of said comparator circuit;
  a first current source coupled between a first supply voltage terminal and said node; and
  a second current source coupled between said second terminal of said switch circuit and a second supply voltage terminal.

5. The oscillator circuit according to claim 4 wherein said second current source provides a current substantially larger than a current provided by said first current source. .

6. The oscillator circuit according to a claim 5 further comprises a buffer circuit coupled between said output of said comparator circuit and said control input of said switch circuit.

7. An oscillator circuit having an output for providing an output signal having a predetermined frequency of oscillation, comprising:

a comparator circuit having first and second inputs and an output, said first input being coupled to a node, and said second input being coupled to a terminal at which a reference voltage is applied;

a capacitor coupled between said first input of said comparator circuit and said output of said comparator circuit, said capacitive means having parasitic capacitances associated therewith;

a switch circuit having first and second terminals and a control input, said first being coupled to said node, and said control input being coupled to said output of said comparator circuit;

a first current source coupled between a first supply voltage terminal and said node; and a second current source coupled between said second terminal of said switch circuit and a second supply voltage terminal.

8. The oscillator circuit according to claim 7 wherein the predetermined frequency of oscillation provided at the output of the oscillator circuit is independent of said parasitic capacitors.

9. The oscillator circuit according to claim 8 wherein said second current source provides a current substantially larger than a current provided by said first current source.

10. The oscillator circuit according to a claim 9 further comprises a buffer circuit coupled between said output of said comparator circuit and said control input of said switch circuit.

* * * * *